United States Patent
Hedler

(10) Patent No.: US 6,887,777 B2
(45) Date of Patent: May 3, 2005

(54) METHOD FOR CONNECTING AN INTEGRATED CIRCUIT TO A SUBSTRATE AND CORRESPONDING CIRCUIT ARRANGEMENT

(75) Inventor: Harry Hedler, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/625,495

(22) Filed: Jul. 23, 2003

(65) Prior Publication Data

US 2004/0130012 A1 Jul. 8, 2004

(30) Foreign Application Priority Data

Jul. 24, 2002 (DE) .......................... 102 33 641

(51) Int. Cl.[7] .............................................. H01L 23/48
(52) U.S. Cl. ..................... 438/612; 257/779; 257/688; 438/117
(58) Field of Search ................................ 257/779, 688, 257/678, 723, 727, 780; 438/612, 117, 106, 121

(56) References Cited

U.S. PATENT DOCUMENTS

| 4,116,517 | A | | 9/1978 | Selvin et al. | |
|---|---|---|---|---|---|
| 5,477,087 | A | | 12/1995 | Kawakita et al. | |
| 5,508,228 | A | | 4/1996 | Nolan et al. | |
| 5,851,337 | A | * | 12/1998 | Chen | 156/275.3 |
| 5,874,782 | A | | 2/1999 | Palagonia | |
| 5,901,050 | A | * | 5/1999 | Imai | 361/820 |
| 5,998,875 | A | | 12/1999 | Bodö | |
| 6,555,415 | B2 | | 4/2003 | Hedler | |
| 2002/0113306 | A1 | * | 8/2002 | Kwon et al. | 257/691 |
| 2003/0067755 | A1 | | 4/2003 | Haimerl et al. | |

FOREIGN PATENT DOCUMENTS

| DE | 199 27 749 A1 | 12/2000 |
|---|---|---|
| EP | 0 295 914 | 12/1988 |
| JP | 03211735 A | 9/1991 |
| WO | WO 01/75969 A1 | 10/2001 |

* cited by examiner

Primary Examiner—Eddie Lee
Assistant Examiner—Douglas W. Owens
(74) Attorney, Agent, or Firm—Fish & Richardson P.C.

(57) ABSTRACT

The present invention provides a method for connecting an integrated circuit to a substrate, which has the following steps: provision of a first electrical contact structure on a first main area of the integrated circuit; provision of a corresponding second electrical contact structure on an upper side of the substrate; at least one of the first and second electrical contact structures having elastic elevations; attachment of a second main area of the integrated circuit to a frame structure; placement of the first electrical contact structure onto the second electrical contact structure, so that the two are in electrical contact; and attachment of the frame structure to the substrate in such a way that the elastic elevations are under compressive stress. The invention likewise provides a corresponding circuit arrangement.

29 Claims, 2 Drawing Sheets

METHOD FOR CONNECTING AN INTEGRATED CIRCUIT TO A SUBSTRATE AND CORRESPONDING CIRCUIT ARRANGEMENT

This application claims priority from German Application Serial No. 102 33 641.5, filed Jul. 24, 2002.

RELATED APPLICATIONS

This application claims priority from German Application Serial No. 102 33 641.5, filed Jul. 24, 2002, the contents of which are incorporated herein by reference.

TECHNICAL FIELD

This invention relates to a semiconductor device, and in particular to a method for connecting an integrated circuit to a substrate and corresponding circuit arrangement.

BACKGROUND

In many applications an integrated circuit must be electrically contacted to a substrate. Known CSP (Chip Size Package) or WLP (Wafer Level Package) solutions for connecting an integrated circuit to a substrate reliability issues exist when there are changes in temperature, in particular in the case of large chips.

In the case of Chip Size Packages and Wafer Level Packages, there are essentially two types of connection structures between the chip and the substrate.

One method for connecting an integrated circuit to a substrate is the use of ball grid arrays with rigid solder balls or bumps for mechanical connection. Underfill can be used to increase stability. In this method, the mismatch of the thermal properties of the chip and the substrate, in particular the coefficient of thermal expansion, leads to great risks in terms of reliability. The solder balls can be sheared off when there are changes in temperature. In the case of large chips, this reduces the reliability considerably.

Various intermediate connecting plates, which serve as a stress buffer between the chip with a low coefficient of thermal expansion and the substrate with a high coefficient of thermal expansion. Such connecting plates prevent undesired defects of this type, but increase the height of the structure, the number of connections, and at the cost.

Another solution for connecting an integrated circuit to a substrate is the use of elastic elevations. In this method, an electronic component has flexible elevations of an insulating material on one surface, an electrical contact is disposed on the flexible elevation, and a conduction path is placed on the surface or in the interior of the flexible elevation between the electrical contact and the electronic circuit. An advantage of this solution is a lower height of the structure, greater reliability and lower cost. In this method, the elastic contact elements are soldered or adhesively bonded onto the substrate.

Common to both groups is that the contact elements are firmly connected to the contact elements of the substrate, either by solder or adhesive. Structures or methods in which the contact elements are not firmly connected to one another are not known.

An object of the present invention is to provide a simple and low-cost method for connecting an integrated circuit to a substrate and a corresponding circuit arrangement which remains largely uninfluenced by thermal mismatching.

SUMMARY

The present invention uses a contact system in which the ends of the contact elements of the integrated circuit and substrate are not firmly connected to one another, but are placed one on top of the other, while being under a specific pressure.

In this case, the electrical contact structure of the integrated circuit and/or the electrical contact structure of the substrate has elastic elevations.

The contact surfaces should have good electrical functionality and be stable for a long time with regard to the pressure contact. The material of the elastic elevations must also retain the desired elasticity in the entire application range.

According to one preferred development, the frame structure at least partially surrounds the integrated circuit laterally with a subregion.

According to a further preferred development, the subregion is a peripheral annular region.

According to a further preferred development, the subregion is an interrupted support region.

According to a further preferred development, the subregion does not touch the surface of the substrate when the first electrical contact structure is placed onto the second electrical contact structure.

According to a further preferred development, heating brings the frame structure in contact with the substrate, the subregion expanding to such an extent that, at a specific temperature, the subregion touches the surface of the substrate. When it cools down, the subregion remains attached to the surface of the substrate.

In the case of this preferred development, a construction which independently creates a pressure on the elastic elevations of the contact elements. It must be ensured that the connection can be maintained in the entire application range, in particular temperature range, without external assistance. Although this embodiment is very advantageous, it is of course also possible in the case of the connection to apply an external pressure, either to create the connection in the first place or to assist this internal effect.

According to a further preferred development, a compression stop region can also be included. This compression stop region limits the compression of the elastic elevations, is provided on the first main area of the integrated circuit.

According to a further preferred development, a wiring metallization is provided on the elastic elevations.

According to a further preferred development, the frame structure has a planar base region, on which the second main area of the integrated circuit is attached and which protrudes laterally beyond the integrated circuit, the subregion being connected to the base region at a lateral distance from the integrated circuit.

According to a further preferred development, the frame structure is formed as one part.

According to a further preferred development, the subregion is adhesively bonded or soldered to the surface of the substrate.

According to a further preferred development, the first electrical contact structure and the second electrical contact structure are brought into mechanical contact in such a way that they are displaceable with respect to each other in the common plane when there is different thermal expansion of the substrate and the integrated circuit. One particular advantage of this development is that, when there are changes in temperature, the contact elements are displaceable in relation to one another, so that the different expansion of the electrical circuit and the substrate does not have any destructive effects, or it is not opposed.

According to a further preferred development, the first electrical contact structure has the elastic elevations and the second electrical contact structure has planar terminal regions.

According to a further preferred development, the planar terminal regions have much greater expansion than seating regions of the elastic elevations.

An exemplary embodiment of the invention is explained in more detail in the description which follows and is represented in the drawings, in which:

DESCRIPTION OF PREFERRED EMBODIMENTS

Figure 1:
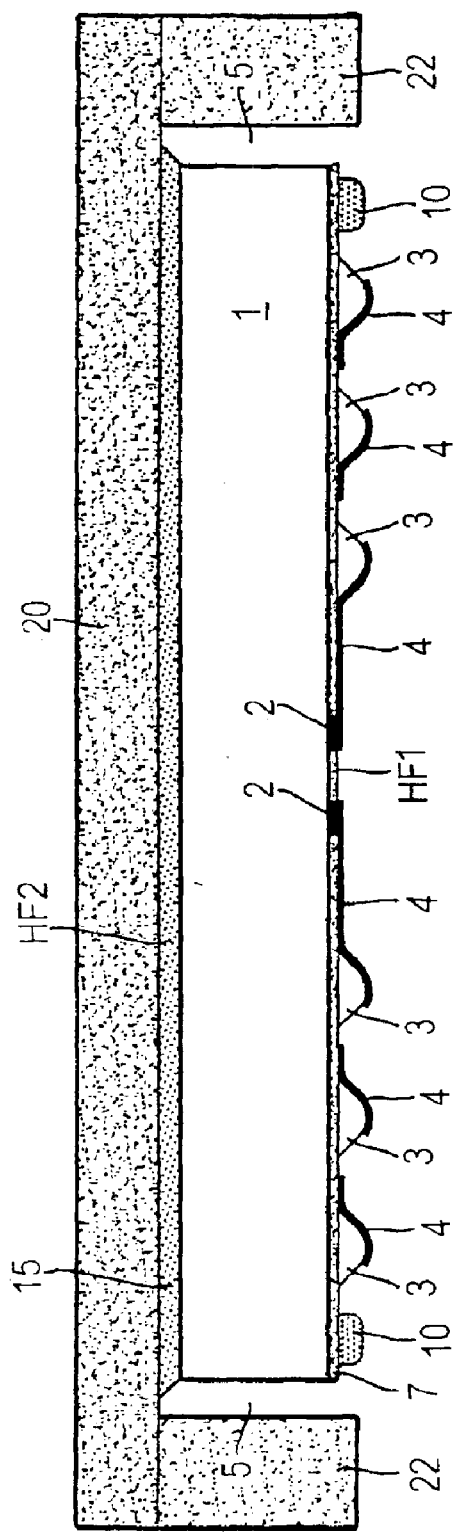
FIG. 1 shows a schematic view of part of a circuit arrangement according to one embodiment of the present invention.

In the figures, the same reference numerals designate the same or functionally the same components.

FIG. 1 is a schematic view of part of a circuit arrangement according to one embodiment of the present invention. Although in the example which follows only one semiconductor chip is illustrated, it should be expressly mentioned that the method according to the invention and the corresponding circuit arrangement can be carried out at a higher level, for example wafer level.

In FIG. 1, shows an integrated circuit 1, which is integrated in a semiconductor chip, for example of silicon, which has a first, front main area HF1 and a second, rear main area HF2. Electrical contacts 2 of integrated circuit 1 are shown on the first main area HF1. An insulating layer 7 lies between the integrated circuit 1 and metallization 4. Contacts 2 connect wiring metallization 4 to the integrated circuit 1 through the insulating layer 7. Provided on the insulating layer 7 are elastic elevations 3, the wiring metallization 4 is led to the tip region of elastic elevations 3. These tip regions represent the electrical contact regions.

Also located in the edge region of the first main area HF1 of the integrated circuit 1, are compression stop elements 10. These compression stop elements 10 are inelastic and are intended to limit the compression of the elastic elevations 3 to a predetermined maximum value. Thus, counteracting possible destruction of the elastic elevations.

The second main area HF2 of integrated circuit 1 is adhesively bonded onto a rear side element 20 of a frame structure by a bonding agent 15. The rear side element 20 extends laterally beyond the extent of the integrated circuit 1. Provided laterally alongside the integrated circuit 1, at a distance created by an intermediate space 5, is an annularly peripheral subregion 22 of the frame structure. In the normal state, i.e. at room temperature, has an extent up to approximately half the height of the elastic elevations 3.

In this embodiment, the subregion 22 is a peripheral ring, but could likewise comprise individual discrete supports. The annular form has the advantage that it allows the packing of the integrated circuit 1 to be made hermetic, i.e. protected from any environmental influences.

In this connection it should be noted that, in the case of this embodiment, the frame structure 20, 22 is specified as being of two parts, but could also quite well be formed as one part.

Figure 2A:
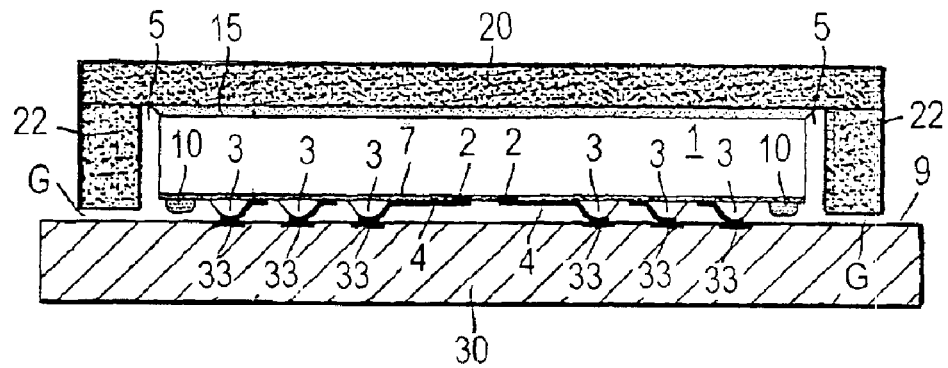
FIGS. 2a–c show schematic representations of a method for connecting the part according to FIG. 1 to a substrate according to one embodiment of the present invention.
Figure 2B:
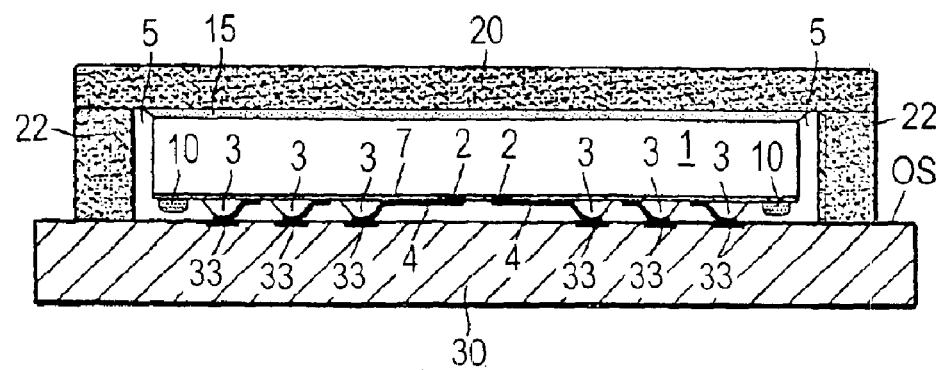
Figure 2C:
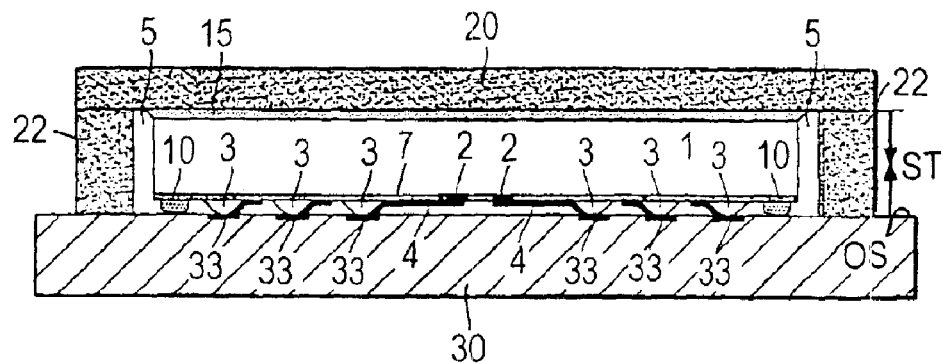

FIGS. 2a–c are schematic representations of a method for connecting the part according to FIG. 1 to a substrate according to one embodiment of the present invention.

In order to attach the part of the circuit arrangement shown in FIG. 1, onto a substrate 30, for example a circuit board, subregions 22 consist of a material which can be adhesively bonded onto the surface OS of substrate 30.

In the case of the exemplary embodiment shown, first, the circuit arrangement shown in FIG. 1 is placed onto substrate 30 in such a way that the contact structure on the first main area of the integrated circuit 1 is placed onto corresponding planar contact regions 33 of the substrate. In this case, there is an intermediate space G between the lower end of the annular subregion 22 and the surface OS of the substrate 30 at normal temperature, for example at room temperature. The subregion 22 has a greater coefficient of thermal expansion than the structure enclosed by it, which includes the adhesive 15, the semiconductor chip with the integrated circuit 1, the elastic elevations 3 and the wiring metallization or else the compression stop elements 10.

The two components are then heated during which subregion 22 expands such that, at a predetermined temperature, it touches the surface OS of the substrate 30 and adhesively bonds to it. During the subsequent cooling down, the bond is retained, producing an internal tensile stress ST. Thus, the elastic elevations 3 are compressed and the wiring metallization 4 is firmly pressed at its tips onto the contact areas 33 of the substrate 30.

In order to avoid excessive compression of the elastic elevations 3, the compression stop region 10 restricts the approach of the electrical circuit 1 to the substrate 30 to a predetermined value.

A major advantage of this embodiment is that the pressure can be generated internally, without the application of an external pressure. Of course, an external pressure can be applied to assist or as an alternative. For example, a pressure could be applied to the rear side of element 20.

When realizing a connection of this type, attention must be paid to the coefficients of thermal expansion and the Young's moduli during material selection. Suitable material for the elastic elevations 3 are materials with a Young's modulus of $E \ll 100$ Gpa. Examples of such materials are silicones or combinations of silicones with gas bubbles to increase the Young's modulus.

Gold is expediently preferred as the contact material for the contact regions. It is inert and stable and is not damaged when there is possible lateral displacement during the cyclical changes in temperature. Of course, other contact materials can be used.

Expedient as the material for the rear side element 20 is metal or a hard epoxy resin. If copper is used as the metal, the coefficient of thermal expansion would be the best that can be adapted to the substrate to avoid any further stresses in the construction.

A suitable material for the subregion 22 would be an epoxy resin with a high coefficient of thermal expansion, which makes it possible to build up the internal pressure in the desired way. It would in this case be possible for the adhesive bond to be realized by a thermoplastic adhesion process, which is not discontinued when cooling down and shrinking occur.

A typical application range lies between $-45°$ C. and $125°$ C. If, for example, $125°$ C. is the maximum temperature of the application of the connection, the temperature at which the adhesive bond between the subregion 22 and the surface OS of the substrate forms must lie above this, in order that the adhesive bond between the subregion 22 and the surface OS of the substrate still remains intact even at 125° C.

In the event that there is a strong thermal mismatch between the subregion 22 and the rear side element 20, there could be problems with the annular form of the subregion 22, so that in this case division of the subregion 22 into individual supports would be helpful.

Although the present invention was described above on the basis of a preferred exemplary embodiment, it is not restricted to this, but can be modified in a variety of ways.

The present invention can be applied in particular not only to chips, but also to hybrids, wafers or other integrated circuits.

What is claimed is:

1. A method for connecting an integrated circuit to a substrate, the method comprising
   providing a first electrical contact structure on the integrated circuit,
   providing a second electrical contact structure on the substrate,
   at least one of the first and second electrical contact structures having an elastic elevation thereon,
   attaching the integrated circuit to a frame structure, the frame structure including a lateral subregion, the lateral subregion at least partially surrounding the integrated circuit and not in contact with a surface of said substrate when said current path is formed
   forming a current path between the first electrical contact structure and the second electrical contact structure, and
   attaching the frame structure to the substrate, thereby compressing the elastic elevation; wherein attaching the frame structure includes:
   applying heat to bring said frame structure in contact with said substrate, such that upon heating, said subregion expands and touches a surface of said substrate, and upon cooling, said subregion remains attached to the surface of said substrate.

2. The method according to claim 1, further comprising selecting
   said subregion to include a peripheral annular region.

3. The method according to claim 1, further comprising selecting
   said subregion to include a region with individual discrete supports.

4. The method according to claim 1, further comprising providing a compression stop region on one of said integrated circuit and said substrate.

5. The method according to claim 1, further comprising providing metallization on the elastic elevation.

6. The method according to claim 1, further comprising providing,
   on said frame structure, a planar base region that protrudes laterally beyond the integrated circuit, and
   connecting said subregion to the base region such that a space exists between said subregion and said integrated circuit.

7. The method according to claim 1, further comprising forming a unitary frame structure in which the subregion and a base region are integral with each other.

8. The method according to claim 1, further comprising adhesively bonding said subregion to said substrate.

9. The method according to claim 1, further comprising soldering said subregion to said substrate.

10. The method according to claim 1, further comprising
    bringing said first electrical contact structure and said second electrical contact structure into mechanical contact, such that
    said first electrical contact structure and said second electrical contact structure are displaceable with respect to each other in a common plane.

11. The method according to claim 1, further comprising disposing said elastic elevation on said first electrical contact structure.

12. The method according to claim 11, wherein
    the second electrical contact structure has a planar terminal region.

13. The method according to claim 12, further comprising
    selecting a material having a thermal expansion coefficient of the planar terminal region to be greater than the thermal expansion coefficient of the elastic elevation.

14. A circuit arrangement manufactured according to the method of claim 1, the circuit arrangement comprising
    a first electrical contact structure on the integrated circuit,
    a corresponding second electrical contact structure on the substrate,
    the first electrical contact structure being in electrical communication with the second electrical contact structure,
    at least one of the first and second electrical contact structures having an elastic elevation thereon,
    a frame structure attached to the integrated circuit and the substrate and being disposed to compress the elastic elevation.

15. A circuit arrangement according to claim 14, wherein
    said frame structure includes a lateral subregion at least partially surrounding the integrated circuit.

16. A circuit arrangement according to claim 15, wherein
    said subregion includes a peripheral annular region.

17. A circuit arrangement according to claim 15, wherein
    said subregion includes a region with individual discrete supports.

18. A circuit arrangement according claim 14, further comprising
    a compression stop region on said integrated circuit.

19. A circuit arrangement according to claim 14, further comprising
    a metallization layer on the elastic elevation.

20. A circuit arrangement according to claim 14, further comprising a planar base region on said frame structure, wherein
    said subregion is connected to a base region protruding laterally beyond the integrated circuit such that a space exists between said integrated circuit and the subregion.

21. A circuit arrangement according claim 14, wherein said frame structure is a unitary piece.

22. A circuit arrangement according to claim 14, further comprising an adhesive between said substrate and said frame.

23. A circuit arrangement according to claim 14 further comprising a solder between said substrate and said frame.

24. A circuit arrangement according claim 14, wherein
    said first electrical contact structure and said second electrical contact structure are in mechanical contact, and
    said first electrical contact structure and said second electrical contact structure are displaceable with respect to each other in a common plane.

25. A circuit arrangement according claim 14, wherein said elastic elevation is connected to said first electrical contact structure.

26. A circuit arrangement according claim 25, wherein said second electrical contact structure has a planar terminal region.

27. A circuit arrangement according to claim 26, wherein the planar terminal region has a thermal expansion coefficient greater than a thermal expansion coefficient of the elastic elevation.

28. A circuit arrangement comprising a first electrical contact structure on the integrated circuit, a corresponding second electrical contact structure on a substrate, the first electrical contact structure being in electrical communication with the second electrical contact structure, at least one of the first and second electrical contact structures having an elastic elevation thereon, and a frame structure attached to the integrated circuit and the substrate and being disposed to compress the elastic elevation, the frame structure including a lateral subregion at least partially surrounding the integrated circuit, the subregion including a region with individual discrete supports.

29. A circuit arrangement comprising a first electrical contact structure on the integrated circuit, a corresponding second electrical contact structure on a substrate, the first electrical contact structure being in electrical communication with the second electrical contact structure, at least one of the first and second electrical contact structures having an elastic elevation thereon, a frame structure attached to the integrated circuit and the substrate and being disposed to compress the elastic elevation; and a compression stop region on said integrated circuit.

\* \* \* \* \*